(12) United States Patent
Chan et al.

(10) Patent No.: US 7,799,608 B2
(45) Date of Patent: Sep. 21, 2010

(54) DIE STACKING APPARATUS AND METHOD

(75) Inventors: Vincent Chan, Richmond Hill (CA); Neil McLellan, Toronto (CA); Kevin O'Neil, Toronto (CA)

(73) Assignee: Advanced Micro Devices, Inc., Sunnyvale, CA (US)

( * ) Notice: Subject to any disclaimer, the term of this patent is extended or adjusted under 35 U.S.C. 154(b) by 274 days.

(21) Appl. No.: 11/832,519

(22) Filed: Aug. 1, 2007

(65) Prior Publication Data
US 2009/0032971 A1    Feb. 5, 2009

(51) Int. Cl.
*H01L 21/44* (2006.01)

(52) U.S. Cl. ............... 438/108; 438/127; 257/E21.503

(58) Field of Classification Search ......... 438/108–109, 438/118, 126, 127; 257/E21.503
See application file for complete search history.

(56) References Cited

U.S. PATENT DOCUMENTS

| | | | |
|---|---|---|---|
| 5,998,243 | A | 12/1999 | Odashima et al. |
| 6,258,626 | B1 | 7/2001 | Wang et al. |
| 6,339,254 | B1 | 1/2002 | Venkateshwaran et al. |
| 6,468,833 | B2 | 10/2002 | Uner et al. |
| 6,576,540 | B2 | 6/2003 | Hsu et al. |
| 6,583,502 | B2 | 6/2003 | Lee et al. |
| 6,593,662 | B1 | 7/2003 | Pu et al. |
| 6,717,253 | B2 | 4/2004 | Yang |
| 6,820,329 | B2 | 11/2004 | Fang |
| 6,853,064 | B2 | 2/2005 | Bolken et al. |
| 6,853,084 | B2 | 2/2005 | Hsu et al. |
| 6,916,685 | B2 | 7/2005 | Yang et al. |
| 7,041,591 | B1 | 5/2006 | Lee et al. |
| 7,057,277 | B2 | 6/2006 | Chen et al. |
| 7,081,402 | B2 | 7/2006 | Hsu et al. |
| 7,109,576 | B2 | 9/2006 | Bolken et al. |
| 7,198,980 | B2 | 4/2007 | Jiang et al. |
| 7,396,753 | B2 | 7/2008 | Chu et al. |
| 7,399,399 | B2 | 7/2008 | Chou et al. |
| 7,485,970 | B2 | 2/2009 | Hsu et al. |
| 7,528,474 | B2 | 5/2009 | Lee |

(Continued)

FOREIGN PATENT DOCUMENTS

EP        1909546 A1    4/2008

(Continued)

OTHER PUBLICATIONS

Tom Krazit; *Intel shows off 80-core processor*; CNET News.com; http://news.com.com/Intel+shows+off+80-core+processor/2100-1006_3; Feb. 11, 2007.

(Continued)

*Primary Examiner*—Thanhha Pham
(74) *Attorney, Agent, or Firm*—Timothy M. Honeycutt (57) ABSTRACT

Various stacked semiconductor devices and methods of making the same are provided. In one aspect, a method of manufacturing is provided that includes providing a first semiconductor die that has a first bulk semiconductor side and a first opposite side. A second semiconductor die is provided that has a second bulk semiconductor side and a second opposite side. The second opposite side of the second semiconductor die is coupled to the first opposite side of the first semiconductor die. Electrical connections are formed between the first semiconductor die and the second semiconductor die.

17 Claims, 4 Drawing Sheets

U.S. PATENT DOCUMENTS

| | | | |
|---|---|---|---|
| 7,545,048 B2 | 6/2009 | Meyer et al. | |
| 7,554,203 B2 * | 6/2009 | Zhou et al. | 257/777 |
| 2002/0006686 A1 | 1/2002 | Cloud et al. | |
| 2003/0111733 A1 * | 6/2003 | Pogge et al. | 257/774 |
| 2004/0106229 A1 * | 6/2004 | Jiang et al. | 438/106 |
| 2005/0167798 A1 * | 8/2005 | Doan | 257/678 |

FOREIGN PATENT DOCUMENTS

WO    WO2006134914 A1    12/2006

OTHER PUBLICATIONS

USPTO Office Action notification date Dec. 24, 2009; U.S. Appl. No. 12/259,957.

PCT/IB2008/002032 International Search Report, dated Jun. 2009.

* cited by examiner

FIG. 10

DIE STACKING APPARATUS AND METHOD

BACKGROUND OF THE INVENTION

1. Field of the Invention

This invention relates generally to semiconductor processing, and more particularly to semiconductor device mounting apparatus and methods.

2. Description of the Related Art

Conventional integrated circuits are frequently implemented on a semiconductor substrate or die that consists of a small rectangular piece of semiconductor material, typically silicon, fashioned with two opposing principal sides. The active circuitry for the die is concentrated near one of the two principal sides. The side housing the active circuitry is usually termed the "active circuitry side," while the side opposite the active circuitry side is often termed the "bulk silicon side." Depending on the thermal output of the die, it may be desirable to mount a heat transfer device, such as a heat sink, on the bulk silicon side of the die. This mounting may be directly on the bulk silicon side or on a lid that is positioned over the die.

A conventional die is usually mounted on some form of substrate, such as a package substrate or a printed circuit board. Electrical connectivity between the die and the underlying substrate or board is established through a variety of conventional mechanisms. In a so-called flip-chip configuration, the active circuitry side of the die is provided with a plurality of conductor balls or bumps that are designed to establish a metallurgical bond with a corresponding plurality of conductor pads positioned on the substrate or circuit board. The die is flipped over and seated with the active circuitry side facing downwards on the underlying substrate. A subsequent thermal process is performed to establish the requisite metallurgical bond between the bumps and the pads. One of the principal advantages of a flip-chip mounting strategy is the relatively short electrical pathways between the integrated circuit and the substrate. These relatively low inductance pathways yield a high speed performance for the electronic device.

In some circumstances it may make sense from a performance standpoint to stack one semiconductor die on another semiconductor die. For example, it may be advantageous to mount a memory device on a processor device. However, electrical interconnects must be established between the stacked dice. Several conventional techniques for stacking dice have been considered.

In one conventional variant, a relatively small semiconductor die is positioned on the bulk semiconductor side of a much larger semiconductor die. Bonding wires are used to establish the electrical conductivity between the upper die and the lower die. The difficulty associated with this approach is that the bonding wires tend to be relatively long electrical pathways and thus exhibit higher than desired inductance and proportionally slower electrical performance. In addition, the bulk semiconductor side is not available for heat sink mounting.

In another conventional variant, a relatively small die is flip-chip mounted on the bulk silicon side of a larger semiconductor die. Electrical interconnects between the upper and lower die are provided by a plurality of conductor traces that are formed on the bulk silicon side of the lower die. As with the first-mentioned conventional design, the conductor traces represent relatively high inductance pathways and thus limit speed performance. Furthermore, the bulk silicon side is not available for a heat sink.

In still another conventional design, a second die is mounted on the bulk silicon side of a larger die. Electrical interconnects between the two are established through a plurality of silicon vias. This design also requires a plurality of external traces and thus represents longer than desired electrical pathways for signal transfer. In addition, the bulk silicon side is not available for a heat sink.

A fourth conventional design consists of a first die upon which a couple of additional dice are positioned. The multiple smaller dice are electrically interconnected with each other and with the larger base die by way of a metal layer that is patterned on the base die and the two top-mounted dice. The metal layer is not unlike a larger scale version of a typical metallization layer used in a semiconductor die. In this regard, a dielectric layer is typically formed over the base die and the multiple top-mounted dice. The dielectric layer is lithographically patterned with openings to selected portions of the base and top-mounted dice. The metallization layer is thereafter deposited over the dielectric layer. This conventional technique requires a very high degree of die alignment, which is not always possible and thus may result in limited yields.

The present invention is directed to overcoming or reducing the effects of one or more of the foregoing disadvantages.

SUMMARY OF THE INVENTION

In accordance with one aspect of the present invention, a method of manufacturing is provided that includes providing a first semiconductor die that has a first bulk semiconductor side and a first opposite side. A second semiconductor die is provided that has a second bulk semiconductor side and a second opposite side. The second opposite side of the second semiconductor die is coupled to the first opposite side of the first semiconductor die. Electrical connections are formed between the first semiconductor die and the second semiconductor die.

In accordance with another aspect of the present invention, a method of manufacturing is provided that includes providing a first semiconductor die that has a first bulk semiconductor side and a first opposite side. A plurality of second semiconductor dice is provided, each of which includes a second bulk semiconductor side and a second opposite side. The second opposite sides of the plurality of second semiconductor dice are coupled to the first opposite side of the first semiconductor die. Electrical connections between the first semiconductor die and the plurality of second semiconductor dice are formed.

In accordance with another aspect of the present invention, an apparatus is provided that includes a first semiconductor die that has a first bulk semiconductor side and a first opposite side. A second semiconductor die has a second bulk semiconductor side and a second opposite side. The second opposite side of the second semiconductor die is coupled to the first opposite side of the first semiconductor die. The second semiconductor die includes electrical connections with the first semiconductor die.

In accordance with another aspect of the present invention, an apparatus is provided that includes a first semiconductor die that has a first bulk semiconductor side and a first opposite side. A plurality of second semiconductor dice is included. Each of the second semiconductor dice includes electrical connections with the first semiconductor die and has a second bulk semiconductor side, and a second opposite side that is coupled to the first opposite side of the first semiconductor die.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
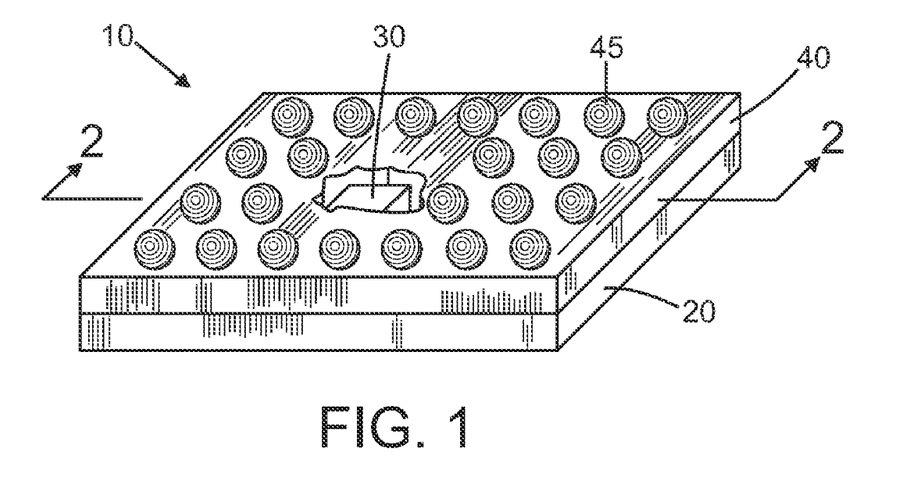
FIG. 1 is a pictorial view of an exemplary embodiment of a semiconductor device that includes stacked semiconductor dice.

In the drawings described below, reference numerals are generally repeated where identical elements appear in more than one figure. Turning now to the drawings, and in particular to FIG. 1, therein is shown a pictorial view of an exemplary embodiment of a semiconductor device 10 that includes a semiconductor die 20 and a semiconductor die 30 mounted on the semiconductor die 20. An insulation layer 40 is positioned on the semiconductor die 20. A portion of the insulation layer 40 is shown cut away to reveal a portion of the semiconductor die 30. The semiconductor dice 20 and 30 may be any of a myriad of different types of circuit devices used in electronics, such as, for example, microprocessors, graphics processors, application specific integrated circuits, memory devices or the like, and may be single or multi-core. The semiconductor dice 20 and 30 may be fabricated using silicon, germanium or other semiconductor materials. If desired, the semiconductor dice 20 and 30 may be fabricated as semiconductor-on-insulator substrates. Several conductor structures 45 are coupled to the semiconductor die 20. The conductor structures 45 are designed to provide interconnects between the semiconductor device 10 and another device as described elsewhere herein. The conductor structures 45 may be fabricated as solder structures of lead-based or lead-free solders and shaped as bumps, balls or other structures. In an exemplary embodiment, a silver-tin-copper solder may be used. Optionally, another type of conductor structure may be used.

Figure 2:
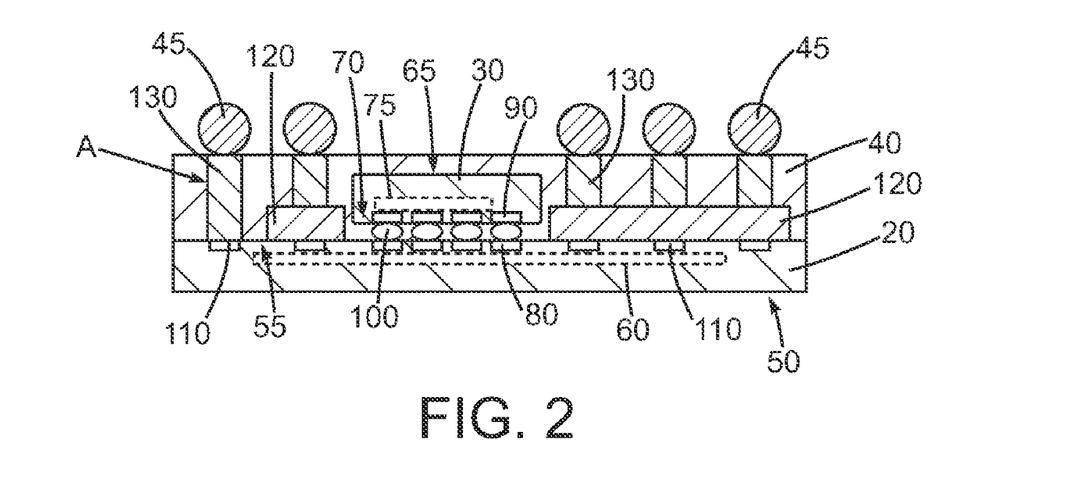
FIG. 2 is a sectional view of FIG. 1 taken at section 2-2.

Additional details of the semiconductor device 10 may be understood by referring now also to FIG. 2, which is a sectional view of FIG. 1 taken at section 2-2. The semiconductor die 20 includes a bulk semiconductor side 50 and an opposite side 55. Chip circuitry of the semiconductor die 20, represented schematically by the dashed box 60 may be fabricated near the side 55. The semiconductor die 30 includes a bulk semiconductor side 65 and an opposite side 70. Chip circuitry of the semiconductor die 30, represented schematically by the dashed box 75, may be fabricated near the side 70. Thus, the opposite side 70 of the semiconductor die 30 is coupled to the opposite side 55 of the semiconductor die 20. This arrangement provides certain advantages described in more detail below.

Exemplary electrical connections between the semiconductor die 20 and the semiconductor die 30 will now be described. The semiconductor die 20 may be provided with plural conductor structures 80 proximate the side 55. The conductor structures 80 may be bond pads or other types of conductor structures composed of, for example, copper, nickel, gold, platinum, silver, alloys of these or the like. In an exemplary embodiment, the conductor structures 80 are composed of an alloy of copper, nickel and gold. The semiconductor die 30 may be provided with plural conductor structures 90 proximate the side 70. The conductor structures 90 may be bond pads or other types of conductor structures, and composed of the same types of materials used for the conductor structures 80. Ohmic contact between the pluralities of conductor structures 80 and 90 may be provided by another plurality of conductors 100 interposed between the sets of conductor structures 80 and 90. The conductors 100 may be composed of solder or other conductor materials. If solder is used, the conductor structures 100 may be fabricated as bumps, balls or other structures and be lead-based or lead-free. In an exemplary embodiment, a silver-tin-copper solder may be used.

This illustrative embodiment provides very short electrical pathways and thus fast signal and power transfer between the semiconductor die 20 and the semiconductor die 30. In addition, the bulk semiconductor side 50 is unfettered, leaving open the possibility of mounting a heat sink (not shown) thereon.

The semiconductor die 20 may be electrically connected to the conductor structures 45 by plural conductor structures 110 positioned proximate the side 55, a metal layer 120 positioned on or proximate the side 55 and plural conductors 130 coupled between the conductor structures 45 and the metallization layer 120. Optionally, a pathway between a given conductor 110 and a given conductor 45 may be provided with a conductor 130, but without the metallization layer 120. Such an arrangement is shown for the conductor 110, the conductor 130 and the conductor 45 located at the position labeled A in FIG. 2. Thus, the conductors 130 may have corresponding conductors 45 and vice versa. The conductor structures 110 may be bond pads or other types of conductor structures composed of the same types of materials used for the conductor structures 110. The metal layer 120 may be a so-called redistribution layer that provides electrical pathways between the various conductor structures 110 of the semiconductor die 20 and the conductor structures 45. When viewed from above, the metallization layer 120 may take on the form of electrical traces that are well known for use on printed circuit boards and other types of electrical substrates. The benefits of routing may be achieved with two or more of the conductors 130 and the conductors 110 connected to the layer 120, however, the number and arrangement of conductor structures 110 and 130 tied to the layer 120 are matters of design discretion. The metal layer 120 may be composed of a myriad of conductor materials, such as copper, nickel, gold, platinum, silver, alloys of these or the like. The conductors 130 may be posts, pillars or other type of mechanical structures and may be composed of, for example, copper, nickel, gold, platinum, silver, alloys of these or the like. In an exemplary embodiment, the conductor structures 130 are composed of an alloy of copper, nickel and gold. The conductors 130 should project farther away from the side 55 of the semiconductor die 20 than does the side 65 so that clearance for the semiconductor die 30 is provided.

The encapsulation layer 40 surrounds the metallization layer 120 and the conductor structures 130 and thus provides lateral support for the conductor structures 130. In addition, the encapsulation layer serves as an underfill material for the region between the semiconductor device 30 and the semiconductor device 20. The encapsulation layer 40 may be fabricated from well-known encapsulation materials, such as epoxy resin with or without fillers such as silica or the like. If desired, the encapsulation layer 40 may be fabricated as a laminate structure. Optionally, a separate underfill material (not shown) of epoxy resin or other well known under fill materials, may be positioned between the semiconductor dice 20 and 30.

Figure 3:
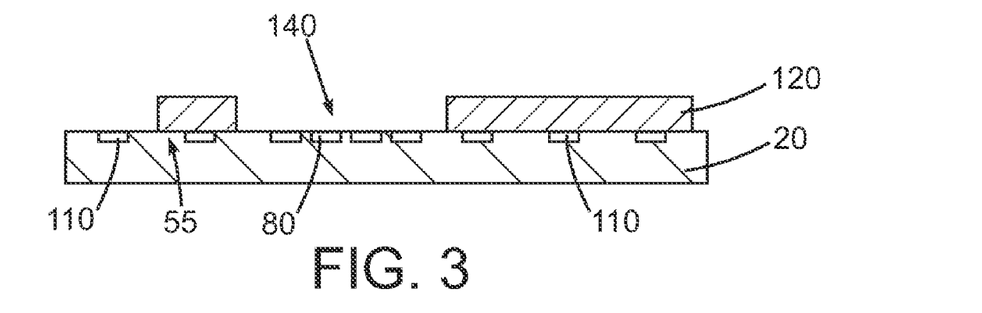
FIG. 3 is a sectional view of an exemplary embodiment of semiconductor die illustrating an exemplary conductor layer fabrication.

An exemplary process for fabricating the semiconductor device 10 maybe understood by referring now to FIGS. 3-7 and initially to FIG. 3. The metallization layer 120 is formed on the surface 55 of the semiconductor device 20. A variety of techniques may be used, such as plating, chemical vapor deposition, physical vapor deposition or the like. It is preferable that the metallization layer 120 includes an opening 140 to accommodate the positioning of the semiconductor device 30 shown in FIGS. 1 and 2. Thus, the metallization layer 120 will establish ohmic contact with the conductor structures 110 but not with the conductor structures 80 that are destined for electrical connectivity with the semiconductor device 30 depicted in FIGS. 1 and 2. If desired, the metallization layer 120 may be built up as a laminate structure.

Figure 4:
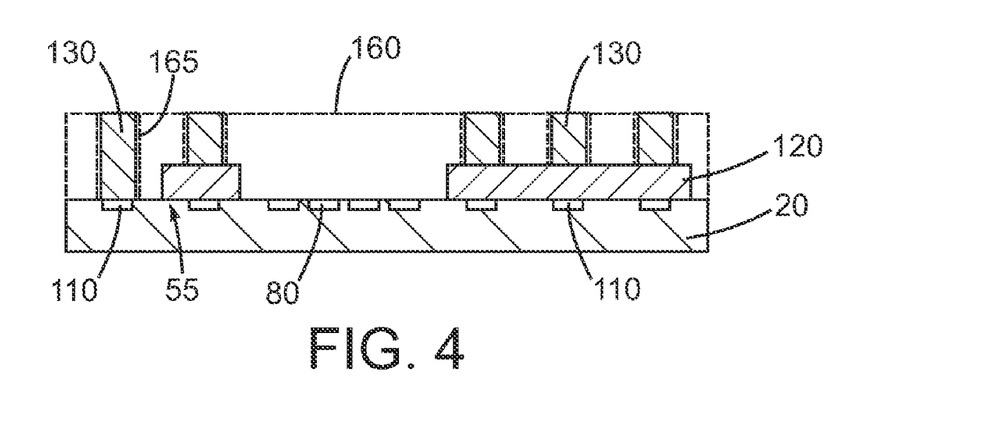
FIG. 4 is a sectional view like FIG. 3 depicting an exemplary process of fabricating conductor structures on the semiconductor die.

The formation of the conductor structures 130 is depicted in FIG. 4. In an exemplary embodiment, a mask of resist or other mask material 160 is formed on the semiconductor die 20 and patterned with openings, one of which is shown and labeled 165, in which a metallic material may be deposited to establish the conductor structures 130. As noted above, the conductor structures 130 may be composed of, for example, copper, nickel, gold, platinum, silver, alloys of these or the like. Following the formation process for the structures 130, the resist film 160 may be removed by well-known ashing or other resist stripping techniques.

Figure 5:
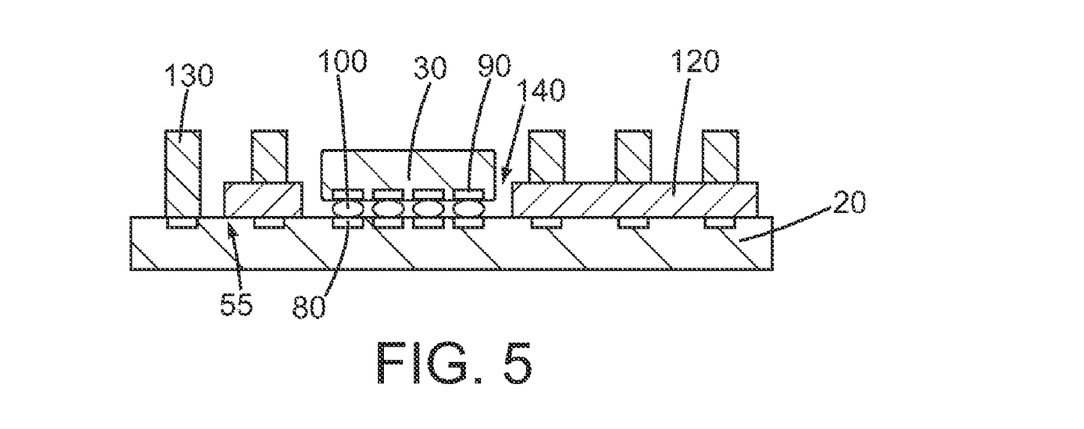
FIG. 5 is a sectional view like FIG.4 depicting an exemplary process of stacking two exemplary semiconductor dice.

Referring now to FIG. 5, the semiconductor device 30 may be flip-chip mounted on the semiconductor die 20 in the opening 140 of the metallization layer 120 by way of the conductor balls or bumps 100. As noted above, electrical pathways are established between the semiconductor die 30 and the semiconductor die 20 by way of the conductor structures 90 on the device 30, the bumps 100 and the conductor structures 80 on the semiconductor die 20. The conductor structures 100 may be coupled first to the semiconductor device 30 or to the device 20 as desired. Following the initial mounting, a reflow process may be performed to temporarily liquify the conductor structures 120. In an exemplary embodiment, the semiconductor device 10 may be heated from about 35° C. up to about 240° C. in about 20 to 120 seconds and then allowed to cool. Optionally, the conductor structures 100 may be formed by reflowing complementary solder structures on both the pads 80 and 90. As noted above, the conductor structures 130 should project farther away from the side 55 of the semiconductor die 20 than does the semiconductor die 30.

Figure 6:
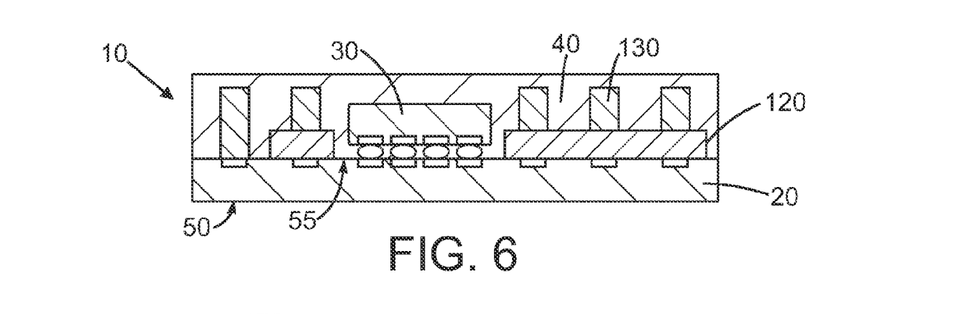
FIG. 6 is a sectional view like FIG. 5 depicting an exemplary process of encapsulating portions of the semiconductor device.
Figure 7:
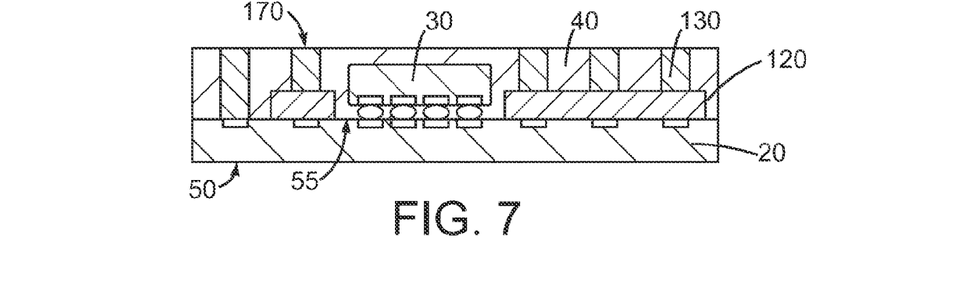
FIG. 7 is a sectional view like FIG. 6, but depicts additional processing of the exemplary semiconductor device.

The formation of the encapsulation layer 40 will now be described in conjunction with FIGS. 6 & 7. The encapsulation layer 40 may be applied to the semiconductor device 10 to encapsulate not only the semiconductor device 30 but also the underlying conductor structures 130 and the metallization layer 100. If desired, the semiconductor die 30 may be less than completely encapsulated. The encapsulation layer 40 may be composed of well-known epoxy materials, such as epoxy resin with or without silica fillers and phenol resins or the like. Optionally, the layer 40 may be formed from a synthetic rubber mixture of epoxy resin, phenol resin, fused silica, and synthetic rubber. It is anticipated that the encapsulation layer 40 may be initially deposited with a greater height than that of the conductor structures 130 as shown.

In order to establish ohmic contact between the subsequently positioned conductor structures 45 (See FIGS. 1 & 2) and the conductor structures 130, it may be necessary to perform a material removal process, such as a grinding or chemical mechanical planarization process on the encapsulation layer 40. FIG. 7 depicts the semiconductor device 10 following the material removal process. The tops 170 of the conductors structures 130 are exposed and ready for attachment of the conductors 45 depicted in FIGS. 1 and 2. The conductor structures 45 may be formed by a variety of processes. If solder balls are used, a drop-in process may be used. Bumps may be formed by well-known plating or stencil processes. If other than solder structures are used, then other well-known techniques may be used.

Figure 8:
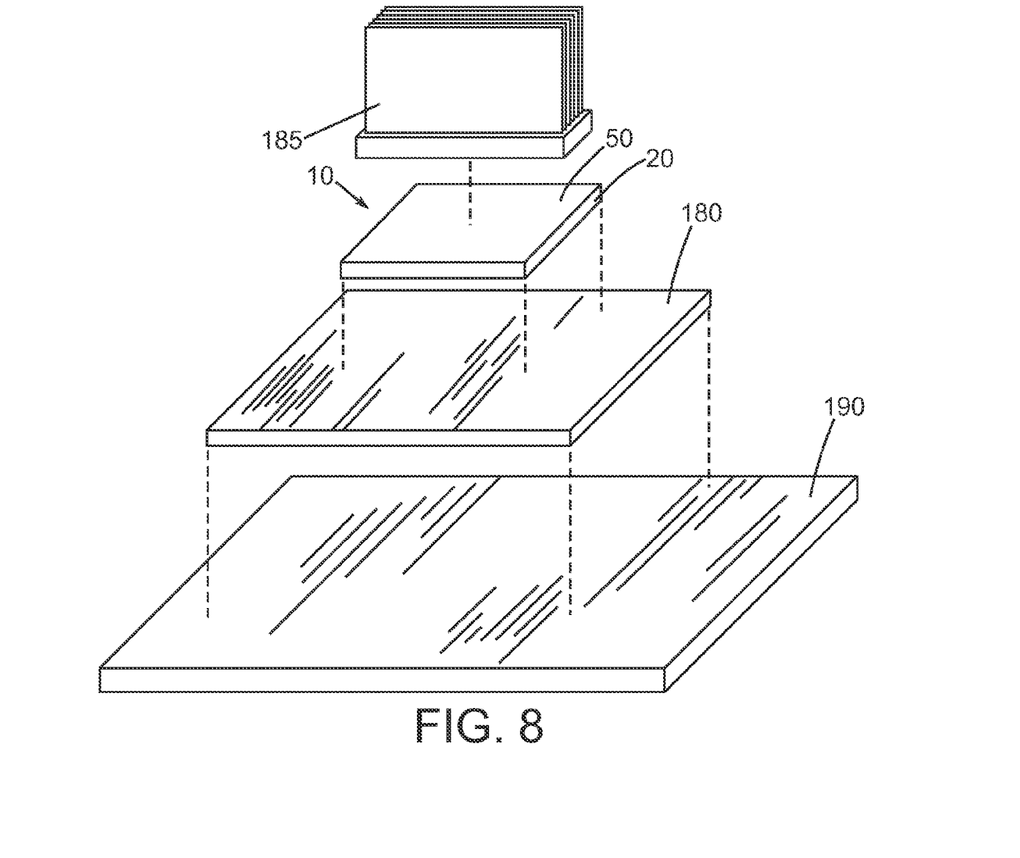
FIG. 8 is an exploded pictorial view of an exemplary embodiment of a semiconductor device depicting some exemplary mounting configurations.

With the semiconductor device 30 mounted on the side 55 of the semiconductor device 20, the bulk semiconductor side 50 of the semiconductor die 20 is still available for positioning of a heat sink. As shown in FIG. 8, which is an exploded pictorial, the semiconductor device 10 may be positioned on another device 180 such that the bulk semiconductor side 50 of the semiconductor die 20 may receive a heat sink 185. The device 180 may be a substrate, a printed circuit board, or other type of substrate. The heat sink 185 may be a fin, pipe or other configuration and may include fluid cooling. Additionally, the device 180 may, in turn, be mounted to another electronic device, such as another printed circuit board, or other type of substrate as desired. For example, the device 180 may be a package substrate and the device 190 may be a printed circuit board. The devices 180 and 190 may be part of some overall system, such as a computer system, or a component of a computer system, such as a discrete board or card.

Figure 9:
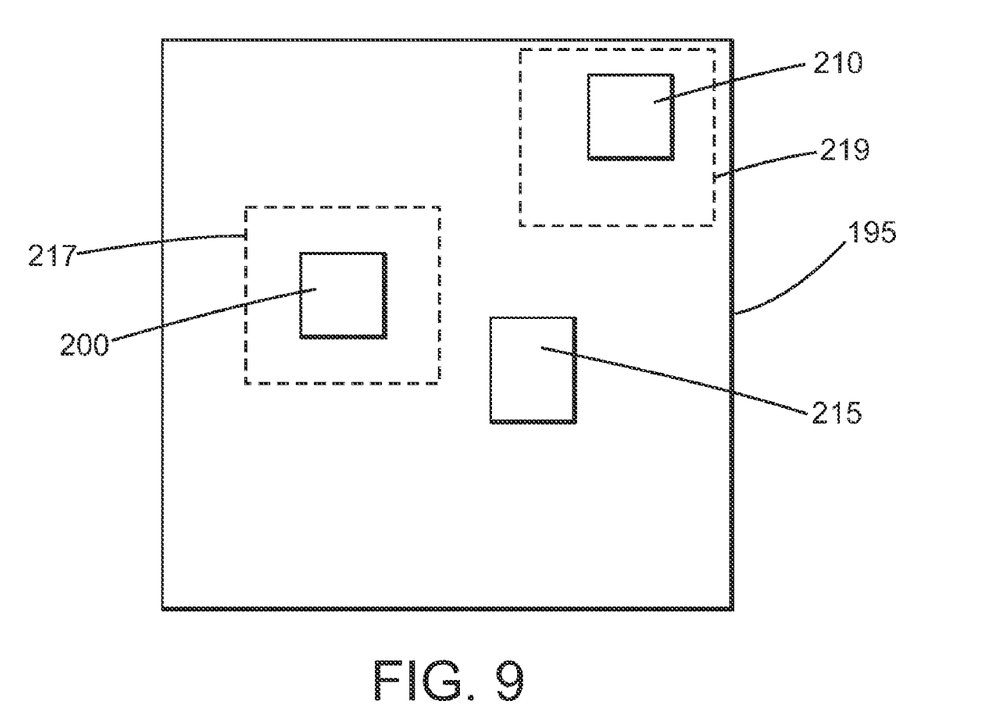
FIG. 9 is a plan view of an alternate exemplary embodiment of a semiconductor device including multiple semiconductor dice stacked on another semiconductor die.

In the embodiment disclosed in FIGS. 1 and 2, a single semiconductor die 30 is mounted on the semiconductor die 20. However, it should be understood that multiple semiconductor devices may be mounted on another semiconductor device in the same fashion as the semiconductor die 30 is mounted on the semiconductor die 20 depicted in FIGS. 1 and 2. In this regard, FIG. 9 depicts an overhead view of a semiconductor die or device 195 upon which three semiconductor dice or devices 200, 210 and 215 are mounted. The devices 195, 200, 210 and 215 may be any of a myriad of different types of circuit devices used in electronics, such as, for example, microprocessors, graphics processors, application specific integrated circuits, memory devices or the like, and may be single or multi-core. If the semiconductor die 195 is implemented as a multi-core device, then each of the semiconductor devices may be positioned over and electrically tied to a particular core. For example, the devices 200 and 210 are positioned near and electrically coupled to respective cores that are represented schematically by the dashed boxes 217 and 219. Optionally, groups of such devices 200, 210 etc. may be tied to a given core.

Figure 10:
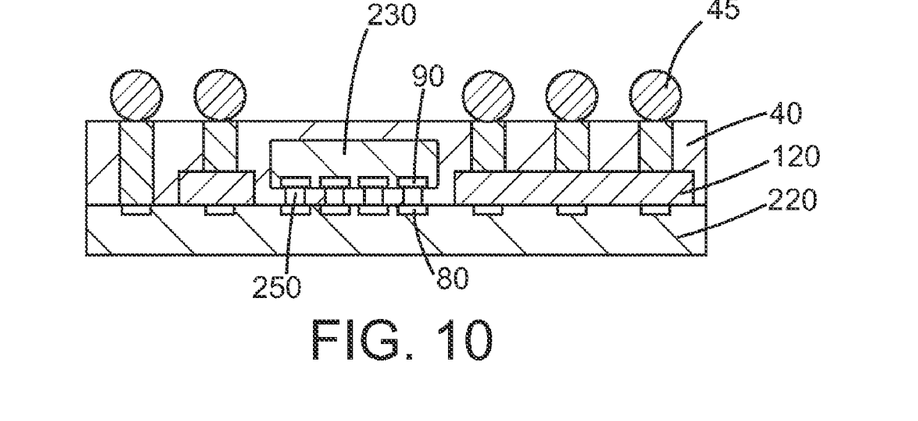
FIG. 10 is a sectional view of another alternate exemplary embodiment of a semiconductor device including stacked semiconductor dice.

In the foregoing illustrative embodiments, conductor bumps or balls are used to establish electrical connectivity between one semiconductor device mounted on another. However, other types of conductor structures may be used. FIG. 10 depicts an alternate exemplary embodiment in which a semiconductor die 220 is provided with the same conductor structures 80, 110 and 130, metallization layer 120 and encapsulation layer 40. External conductivity may be provided by the aforementioned conductor structures 45. However, electrical connections between a mounted semiconductor die 230 and the semiconductor die 220 may be established by way of conductor posts or pillars 240 that are positioned between corresponding conductor structures 90 of the semiconductor die 230 and corresponding conductor structures 80 of the semiconductor die 220. The conductor posts 250 may be composed of, for example, copper, nickel, gold, platinum, silver, alloys of these or the like. Various fabrication techniques may be used, such as plating, chemical vapor deposition, physical vapor deposition or the like.

It should be understood that the fabrication processes described herein may be performed on an individual single die or currently on multiple die that are part of some larger semiconductor workpiece, such as a wafer. The wafer can then be singulated into individual dice.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    providing a first semiconductor die having a first bulk semiconductor side and a first opposite side;
    providing a second semiconductor die having a second bulk semiconductor side and a second opposite side;
    coupling the second opposite side of the second semiconductor die to the first opposite side of the first semiconductor die;
    forming electrical connections between the first semiconductor die and the second semiconductor die;
    forming a metal layer on the first opposite side of the first semiconductor die;
    coupling a plurality of conductor structures on the metal layer, each of the conductor structures including a conductor post and a solder structure coupled to the conductor post wherein the conductor post extending away from the first opposite side of the first semiconductor die farther than the second bulk semiconductor side of the second semiconductor die; and
    encapsulating the second semiconductor die and at least a portion of each of the conductor structures.

2. The method of claim 1, wherein the forming the electrical connections comprises forming solder structures or conductor pillars.

3. The method of claim 1, comprising encapsulating the second semiconductor die without an interposer present.

4. The method of claim 1, wherein the coupling the plurality of conductor structures comprises forming a plurality of conductor posts extending away from the first opposite side of the first semiconductor die farther than the second bulk semiconductor side of the second semiconductor die and a plurality of solder structures on the plurality of conductors posts.

5. The method of claim 1, wherein the providing the first semiconductor die comprises providing a processor.

6. The method of claim 5, wherein the providing the second semiconductor die comprises providing a memory device.

7. The method of claim 1, comprising coupling a first substrate to the first or second semiconductor die.

8. The method of claim 7, comprising coupling a second substrate to the first substrate.

9. A method of manufacturing, comprising:
    providing a first semiconductor die having a first bulk semiconductor side and a first opposite side;
    providing a plurality of second semiconductor dice, each of of second semiconductor dice having a second bulk semiconductor side and a second opposite side;
    coupling the second opposite sides of the plurality of second semiconductor dice to the first opposite side of the first semiconductor die;
    forming electrical connections between the first semiconductor die and the plurality of second semiconductor dice;
    forming a metal layer on the first opposite side of the first semiconductor die;
    forming a plurality of conductor structures on the first opposite side of the first semiconductor die, each of the conductor structures including a conductor post and a solder structure coupled to the conductor post wherein the conductor post extending away from the first opposite side of the first semiconductor die farther than the second bulk semiconductor sides of the plurality of second semiconductor dice wherein at least two of the conductor structures electrically coupling to the same portion of the metal layer; and
    encapsulating the plurality of second semiconductor dice and at least a portion of each of the conductor structures.

10. The method of claim 9, wherein the forming the electrical connections comprises forming solder structures.

11. The method of claim 9, comprising encapsulating the plurality of second semiconductor dice without an interposer present.

12. The method of claim 9, wherein the forming the plurality of conductor structures comprises forming a plurality of conductor posts extending away from the first opposite side of the first semiconductor die farther than the second bulk semiconductor sides of the second semiconductor dice and a plurality of solder structures coupled to the plurality of conductor posts.

13. The method of claim 9, wherein the providing the second plurality of semiconductor dice comprises providing a plurality of memory devices.

14. The method of claim 9, comprising coupling a first substrate to the first semiconductor die.

15. The method of claim 14, comprising coupling a second substrate to the first substrate.

16. The method of claim 9, wherein the providing the first semiconductor die comprises providing a semiconductor die including a plurality of cores, and wherein the forming the electrical connections comprises electrically connecting at least one of the plurality of the second semiconductor dice to at least one of the cores.

17. A method of manufacturing, comprising:
    flip-chip mounting a first semiconductor die to a side of a second semiconductor die;
    forming a metal layer on the side of the second semiconductor die;

coupling a plurality of conductor structures on the metal layer, each of the conductor structures including a conductor post and a solder structure coupled to the conductor post wherein the conductor post extending away from the side of the second semiconductor die and farther than the first semiconductor die wherein at least two of the conductor structures electrically coupling to the same portion of the metal layer; and encapsulating the first semiconductor die and at least a portion of each of the plurality of conductor posts.

* * * * *